United States Patent [19]
Bosacchi

[11] Patent Number: 6,111,424
[45] Date of Patent: Aug. 29, 2000

[54] TESTING METHOD AND APPARATUS FOR FLAT PANEL DISPLAYS USING INFRARED IMAGING

[75] Inventor: Bruno Bosacchi, Belle Meade Township, Somerset County, N.J.

[73] Assignee: Lucent Technologies Inc., Murray Hill, N.J.

[21] Appl. No.: 08/923,507

[22] Filed: Sep. 4, 1997

[51] Int. Cl.$^7$ .................................................. G01R 31/02
[52] U.S. Cl. ........................ 324/770; 324/158.1; 382/149
[58] Field of Search ................................ 324/770, 158.1, 324/96, 760, 753, 750, 537, 527, 528, 501; 382/325, 145, 149; 345/87

[56] References Cited

U.S. PATENT DOCUMENTS

| 5,309,108 | 5/1994 | Maeda et al. | 324/770 |
| 5,406,213 | 4/1995 | Henley | 324/753 |
| 5,740,272 | 4/1998 | Shimada | 324/770 |

OTHER PUBLICATIONS

"Liquid crystals plot the hot spots."; Electronic Design, pp. 71–79, Sep. 1967.

J. A. Castellano, Handbook of Display Technology (Academic Press, 1992, Ch. 8, Section 8.1.3) pp. 186–196.

*Primary Examiner*—Jay Patidar
*Attorney, Agent, or Firm*—Ryan & Mason, L.L.P.

[57] ABSTRACT

An in-process method for testing an active plate of a flat panel display, such as a liquid crystal display (LCD), is disclosed. An infrared thermal analyzer, including an infrared (IR) camera and an image analyzer, is preferably utilized for recording and analyzing heating response characteristics of the active plate upon application of an appropriate electric signal. An active plate is tested during the fabrication process using IR thermography techniques to evaluate the IR emission of the active plate when an electric voltage uniformly powers the array of pixels in the active plate. The testing technique of the present invention exhibits minimal invasiveness, as only the shorting bars of the active plate are electrically assessed. The heating response characteristics of the active plate are preferably not evaluated until the active plate reaches a stable operating temperature. In the absence of defects, each pixel in the array heats up uniformly, and upon detection by an infrared camera, a uniform IR image is obtained across the plate. If there are defects in the active plate, however, such as one or more open lines, short circuits, or other non-uniform electric parameters, the various pixels in the active plate do not heat up uniformly and will reach different operating temperatures. A defective plate will dissipate IR energy in a non-uniform manner, and upon detection by an infrared camera, a non-uniform image of the active plate is obtained, providing a map of any defects on the plate. The heating dynamics of the active plate can be time-resolved as the pixels of the active plate heat up in response to an applied electric signal. The reliability of an active plate can be evaluated by applying a voltage having a higher magnitude than the typical operating voltage of the flat panel display device.

24 Claims, 7 Drawing Sheets

TESTING METHOD AND APPARATUS FOR FLAT PANEL DISPLAYS USING INFRARED IMAGING

FIELD OF THE INVENTION

The present invention relates generally to a method and apparatus for testing of flat panel displays, and more particularly, to an in-process method and apparatus for testing an active plate of a flat panel display.

BACKGROUND OF THE INVENTION

Liquid crystal and other flat panel displays are increasingly being utilized for various applications, from color televisions and computer monitors to roadside signs. Such devices are typically fabricated utilizing well-known clean room fabrication techniques. Nonetheless, dust, other microparticles and other factors often lead to defects, such as open circuits or short circuits, in the increasingly high-density environment of an active matrix liquid crystal display. The poor manufacturing yields, which may be as low as ten percent (10%), as well as the time and expense required to test such devices, have greatly contributed to the fabrication costs associated with such devices.

Initially, flat panel displays were not tested until the final assembly stage, when the addressing circuitry, referred to as the active plate, was integrated with the liquid crystal material. The testing process consisted of activating the final display, and visually inspecting the device for defects. At this final stage, however, identified defects could not be repaired in a practical manner.

It was observed that most defects occurred in the active plate. Thus, in order to increase the manufacturing yield associated with flat panel displays, in process testing of the active plates, before the liquid crystal material was applied, was proposed. Initially, the in-process testing methods consisted of a probing method to electrically access each individual row and column intersection of the pixel array. Although such contact techniques effectively identified defects in an active plate, prior to final assembly, they were extremely time-consuming.

In addition, in-process voltage imaging techniques, such as those developed by Photo Dynamics, Inc., and described, for example, in U.S. Pat. No. 5,570,011 to Henley, entitled "Method For Testing a Device Using Voltage Imaging," utilize an electro-optical probe to image the electric field at a pixel. Again, although such voltage imaging techniques effectively identify defects in an active plate, prior to final assembly, the electro-optical probe has a narrow field of view and must be positioned a short distance from the plate. Thus, a time-consuming step-and-repeat approach must be implemented to image an entire active plate.

It is known to test printed circuit boards (PCBs) and other circuits fabricated with VLSI techniques using infrared (IR) thermography. Generally, IR thermography techniques detect the IR emission of the circuit being tested when an electric signal is applied and compare the heating response characteristics to a known defect-free sample. U.S. Pat. No. 3,991,302 to Danner, entitled "Method For Detecting and Isolating Faults in Digital and Analog Circuits With Multiple Infrared Scanning Under Conditions of Different Stimuli," for example, discloses a method for detecting faults in circuits based on infrared heating response characteristics.

As apparent from the above-described deficiencies with conventional systems for testing an active plate of a flat panel display, a need exists for an improved non-invasive diagnostic method for in-process testing. A further need exists for a faster and more efficient diagnostic method for in-process testing. Yet another need exists for a diagnostic method for in-process testing using commercially available components. Another need exists for a diagnostic method for in-process testing that permits defects to be localized to facilitate repair and tolerates imaging at further distances from the active plate.

SUMMARY OF THE INVENTION

Generally, according to one aspect of the present invention, an in-process method and apparatus tests an active plate of a flat panel display. The flat panel display may be an active matrix liquid crystal display (AMLCD) or any other device where an electric field is applied to an array of uniform pixels to control transparency or emission of light and where electrical energy is dissipated on a resistive structure. The display testing apparatus preferably utilizes an infrared thermal analyzer including an infrared (IR) camera and an image analyzer, for recording and analyzing heating response characteristics of the active plate upon application of an appropriate electric signal. The electric voltage applied to the active plate can be an AC signal, a DC signal or a pulsed signal.

According to a further aspect of the invention, an active plate for use with a flat panel display device is tested during the fabrication process using IR thermography techniques. The active plate is tested by evaluating the IR emission of the active plate when an electric voltage is applied to shorting bars of the active plate, to uniformly power the array of pixels in the active plate. In this manner, the testing technique of the present invention exhibits minimal invasiveness, as only the shorting bars of the active plate are electrically accessed. The active plate consists of an array of uniform pixels. Thus, pixels having identical electrical characteristics should heat up in a uniform manner over time, as each pixel reaches a stable operating temperature. The heating response characteristics of the active plate are preferably evaluated after the active plate reaches a stable operating temperature. In addition, the dynamics of the heating response characteristics of the active plate, such as the rate of heating, may be evaluated to indicate defects in the active plate.

In the absence of defects, each pixel in the array heats up uniformly, and upon detection by an infrared camera, a uniform IR image is obtained across the plate. If there are defects in the active plate, however, such as one or more open lines, short circuits, or other non-uniform electric parameters, the various pixels in the active plate do not heat up uniformly and will reach different operating temperatures. Thus, the defective active plate dissipates IR energy in a non-uniform manner, and upon detection by an infrared camera, a non-uniform image of the active plate is obtained, providing a map of any defects on the plate. In the presence of defects, the infrared camera records an image of the active plate having bright spots and dark spots, relative to an expected uniform image intensity, corresponding to defective regions of the active plate.

In the illustrative implementation, the final operating temperature of each pixel, upon application of a particular electric signal, is detected. In alternate embodiments, the heating dynamics of the active plate can be time-resolved as the pixels of the active plate heat up in response to an applied electric signal. According to a further feature of the invention, the reliability of an active plate can be evaluated by applying a voltage having a higher magnitude than the typical operating voltage of the flat panel display device.

A more complete understanding of the present invention, as well as further features and advantages of the present invention, will be obtained by reference to the following detailed description and drawings.

BRIEF DESCRIPTION OF THE DRAWINGS

FIG. 2b shows an illustrative schematic diagram of a typical pixel of FIG. 2a;

DETAILED DESCRIPTION

Figure 1:
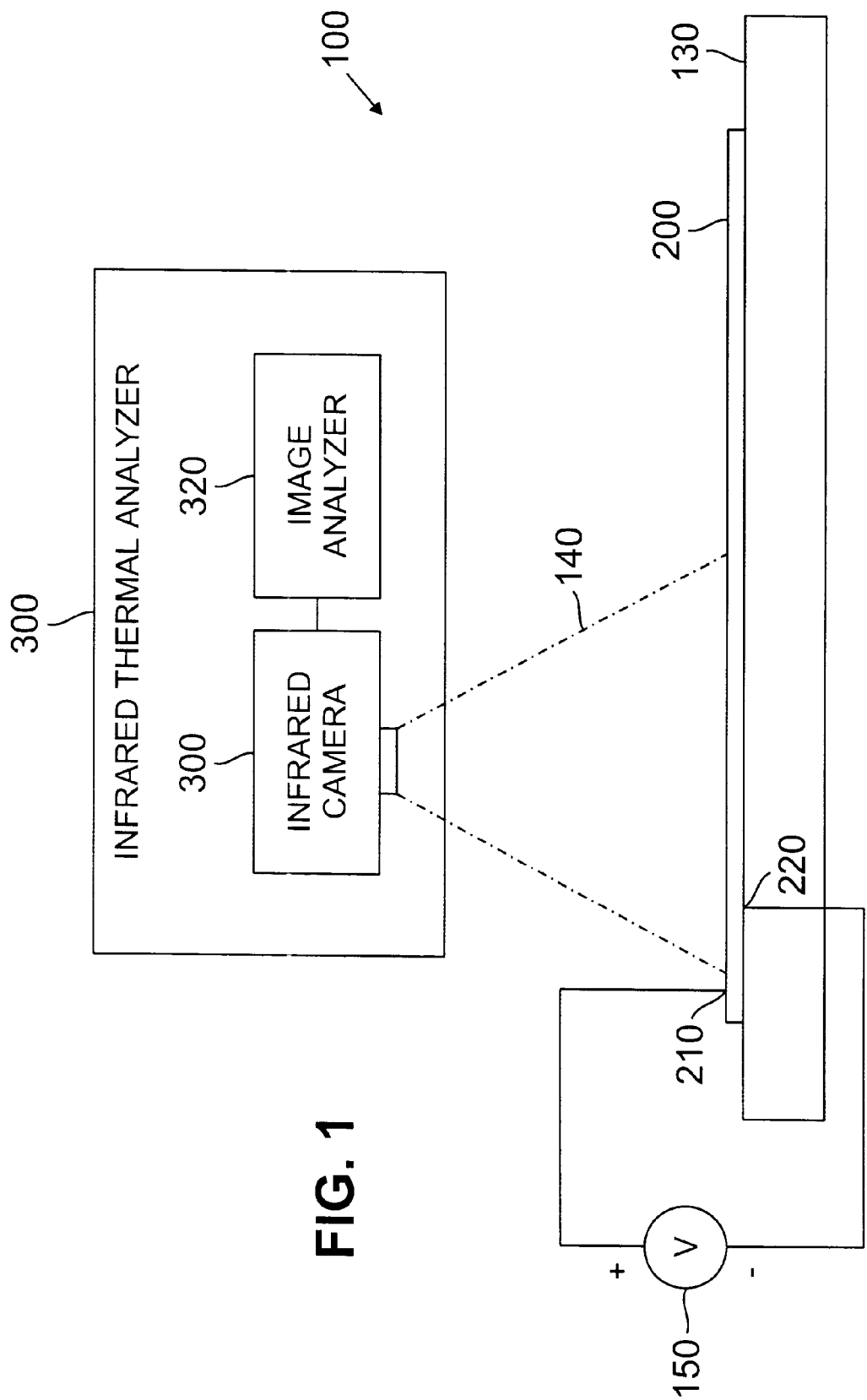
FIG. 1 is a schematic block diagram illustrating a display testing apparatus in accordance with one embodiment of the present invention.

FIG. 1 is a schematic block diagram illustrating the components of a display testing apparatus 100 incorporating features of the present invention, for testing an active plate 200, discussed further below in conjunction with FIG. 2a, of a flat panel display device, such as an active matrix liquid crystal display (AMLCD) (not shown), or any other device where an electric field is applied to an array of uniform pixels to control transparency or emission of light and where electrical energy is dissipated on a resistive structure, such as a plasma display. As discussed further below, the display testing apparatus 100 includes an infrared (IR) camera 310 and an image analyzer 320, for respectively recording and analyzing heating response characteristics of the active plate 200 upon application of an appropriate electric signal. The infrared camera 310 and the image analyzer 320 may be embodied as separate units or as part of a single integrated device, such as an infrared thermal analyzer 300, discussed further below in conjunction with FIG. 3. The active plate 200 is preferably positioned on a suitable holding plate 130 during testing.

According to a feature of the present invention, an illustrative active plate 200 for use with a flat panel display device is tested during the fabrication process using IR thermography techniques. As used herein, an "active plate" refers to an array of thin-film transistors (TFTs), or other circuitry for selectively addressing individual pixels of an array, deposited on a substrate or other non-conductive material. Specifically, an active plate 200 is tested by evaluating the IR emission of the active plate 200 when an electric voltage, produced by a voltage source 150, is applied to shorting bars 210, 220 on the active plate 200, to uniformly power the array of pixels 230 in the active plate 200.

Figure 2A:
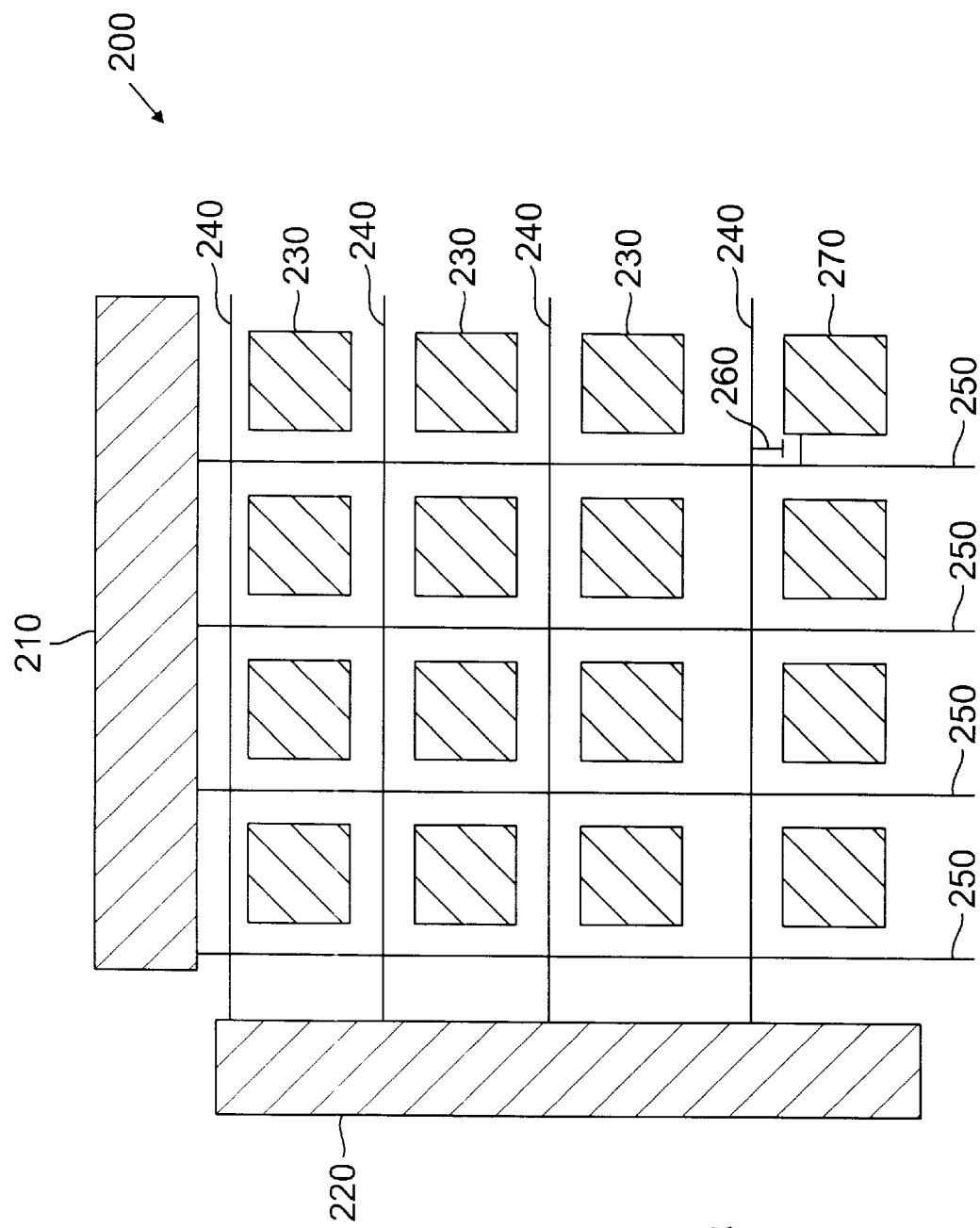
FIG. 2a shows an illustrative active plate having a plurality of pixels, to be tested by the display testing apparatus of FIG. 1.

As shown in FIG. 2a, the shorting bars 210, 220 connect the gate and data lines 240, 250 of the active plate 200. In this manner, the testing technique of the present invention exhibits minimal invasiveness, as only the shorting bars 210, 220 of the active plate 200 are electrically accessed. It is noted that the shorting bars 210, 220 are provided during the fabrication process to prevent damage to the active plate 200 due to electro-static discharge (ESD). The shorting bars 210, 220 are typically removed from the active plate 200 before final assembly of the flat panel display, once the risk of ESD damage to the active plate 200 is reduced.

Figure 2B:
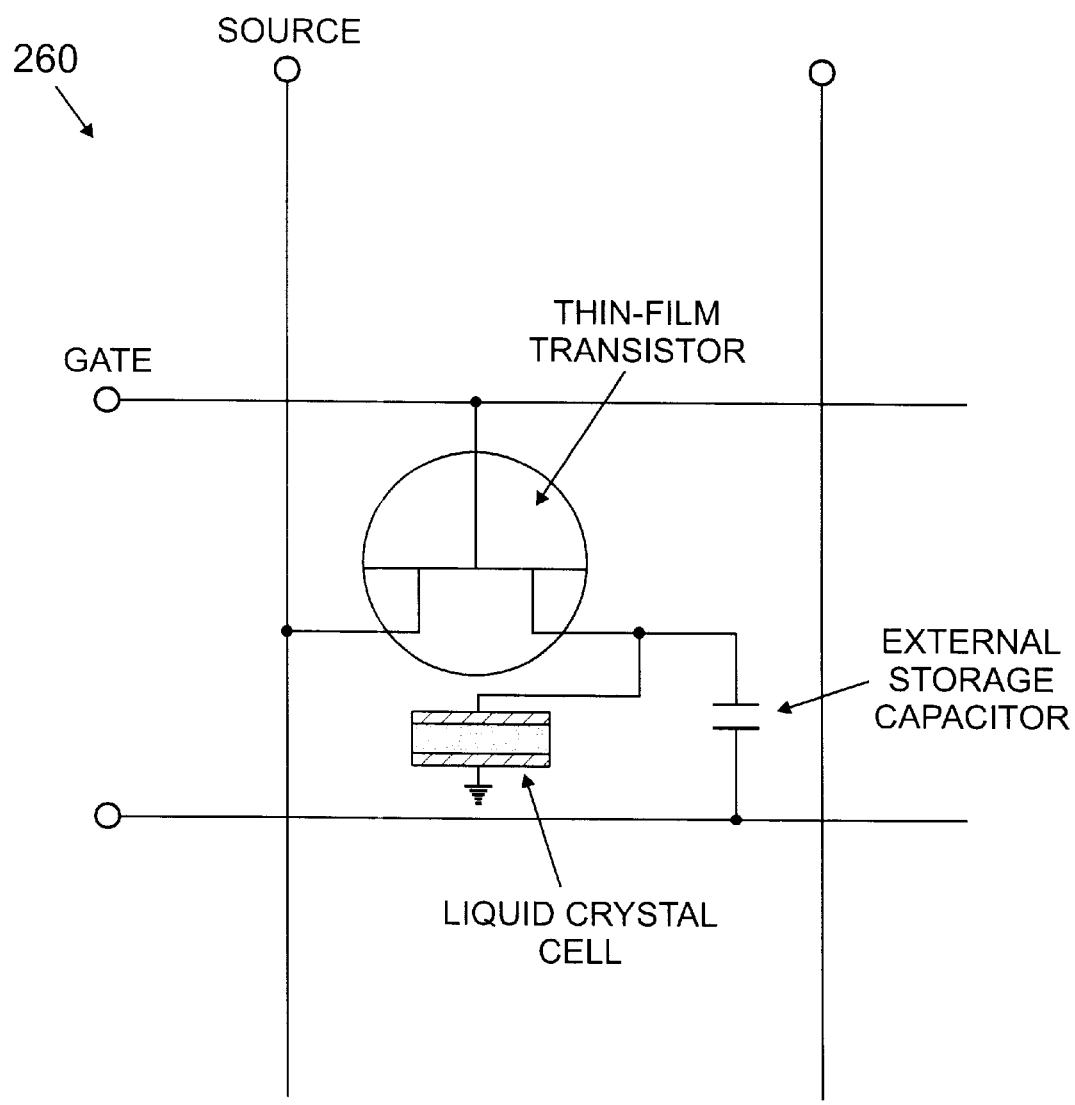

In an active matrix implementation, the active plate 200 typically consists of an array of uniform pixels, with each pixel including a thin-film transistor and a capacitor, as shown in FIG. 2b. Thus, each pixel operates like a resistive-capacitive (RC) circuit, dissipating heat when the circuit is charged and discharged. In the illustrative embodiment described herein, the charge/discharge cycle of the actual operation of the active plate 200 being tested is simulated. If a single cycle provides the minimum dissipation required for being detected, a DC signal may be applied. In general, however, the cycle may have to be repeated, and depending on the characteristics of the device, an AC signal having an appropriate frequency is utilized. Generally, the higher the frequency, in accordance with the characteristics of the device, the shorter the time to reach the stable operating temperature.

In theory, pixels having identical electrical characteristics should heat up in a uniform manner over time, as each pixel reaches a stable operating temperature. It is noted that the heating response characteristics of the active plate 200 are preferably evaluated after the active plate 200 dissipates sufficient heat to be detected by the infrared camera 310. It is noted that the lowest threshold depends on the electrical characteristics of each active plate 200 and the sensitivity of the infrared camera 310. In addition, as discussed below, the heating response characteristics of the active plate 200 are preferably not evaluated until the active plate 200 reaches a stable operating temperature. Generally, the appropriate waiting period is a function of the electrical characteristics of the pixel configuration, as would be apparent to a person of ordinary skill. In particular, the appropriate waiting time depends on the pixel characteristics and the modalities of power application. As indicated above, the waiting time may be shortened by increasing the frequency with which the power is applied, and then cleared.

If there are no defects in an active plate 200, each pixel in the array heats up uniformly, and upon detection by an infrared camera 310, a uniform IR image is obtained across the plate 200. If there are defects in the active plate 200, however, such as one or more open lines, short circuits, or other non-uniform electric parameters, the various pixels in the active plate 200 do not heat up uniformly and will reach different operating temperatures. Thus, the defective active plate 200 dissipates IR energy in a non-uniform manner, and upon detection by an infrared camera 310, a non-uniform image of the active plate 200 is obtained, providing a map of any defects on the plate 200.

In the presence of defects, the infrared camera 310 records an image of the active plate 200 having bright spots and dark spots, relative to an expected uniform image intensity, corresponding to defective regions of the active plate 200. It is noted that the expected image intensity value can be obtained by averaging the pixel intensity values of a given image frame, or by means of a reference frame corresponding to an ideal or defect-free active plate 200. As discussed further below in conjunction with FIGS. 3 and 5, the image analyzer 320 evaluates the images produced by the infrared camera 310 and preferably localizes regions containing defective pixels.

In one preferred embodiment, discussed further below, the heating response characteristics of the active plate 200, such as the rate of heating, are evaluated under varying voltage conditions. In the illustrative implementation discussed herein, the final operating temperature of each pixel, upon application of a particular electric signal, is detected. In an alternate environment, the heating dynamics of the active plate 200 can be time-resolved as the pixels of the active plate 200 heat up in response to an applied electric signal. As previously indicated, the identical pixels of an active plate 200 should heat up in a uniform manner over time. Thus, any deviation in the heating response indicates a non-uniformity in the electrical characteristics of a given pixel. Accordingly, by evaluating the rate of heating of the active plate 200 over time, upon application of the required voltage, more detailed information is obtained on the nature of the defects. In a time-resolved implementation, various images of the active plate 200 are taken by the infrared camera 310 as the pixels heat up.

According to a further feature of the invention, the reliability of an active plate 200 can be evaluated by applying a voltage having a higher magnitude than the typical operating voltage of the flat panel display device. In this manner, devices exhibiting poor reliability can be identified and discarded. It is noted that the voltage applied to the active plate 200 by the image capture process 400, discussed further below in conjunction with FIG. 4, may be higher than the recommended operating voltage of the device, provided that the applied voltage does not damage the device, and thereby shorten the time required to reach a stable operating temperature. In this manner, the inspection of the active plate 200 for defects is combined with a reliability test.

As discussed above, the electric voltage applied to the shorting bars 210, 220 can be an AC signal, a DC signal or a pulsed signal. In addition, by varying the frequency of an AC voltage signal, or a pulsed DC voltage signal, the charge/discharge cycling of the active plate 200 is varied, and the information obtained is further enriched. Generally, at higher frequencies, the pixels 230 of the active plate 200 will heat up faster.

FIG. 2a shows an illustrative active plate 200, having a plurality of pixels 230. A given pixel, such as the pixel 270, may be selectively activated by application of an appropriate voltage to the respective data line 240 and gate line 250, which thereby activates an associated thin film transistor (TFT), such as the TFT 260 shown generally in FIG. 2a for pixel 270, and in greater detail in FIG. 2b. For a detailed discussion of the operation of an active matrix LCD, see J. A. Castellano, Handbook of Display Technology (Academic Press, 1992, Ch. 8, Section 8.1.3), incorporated by reference herein.

Figure 3:
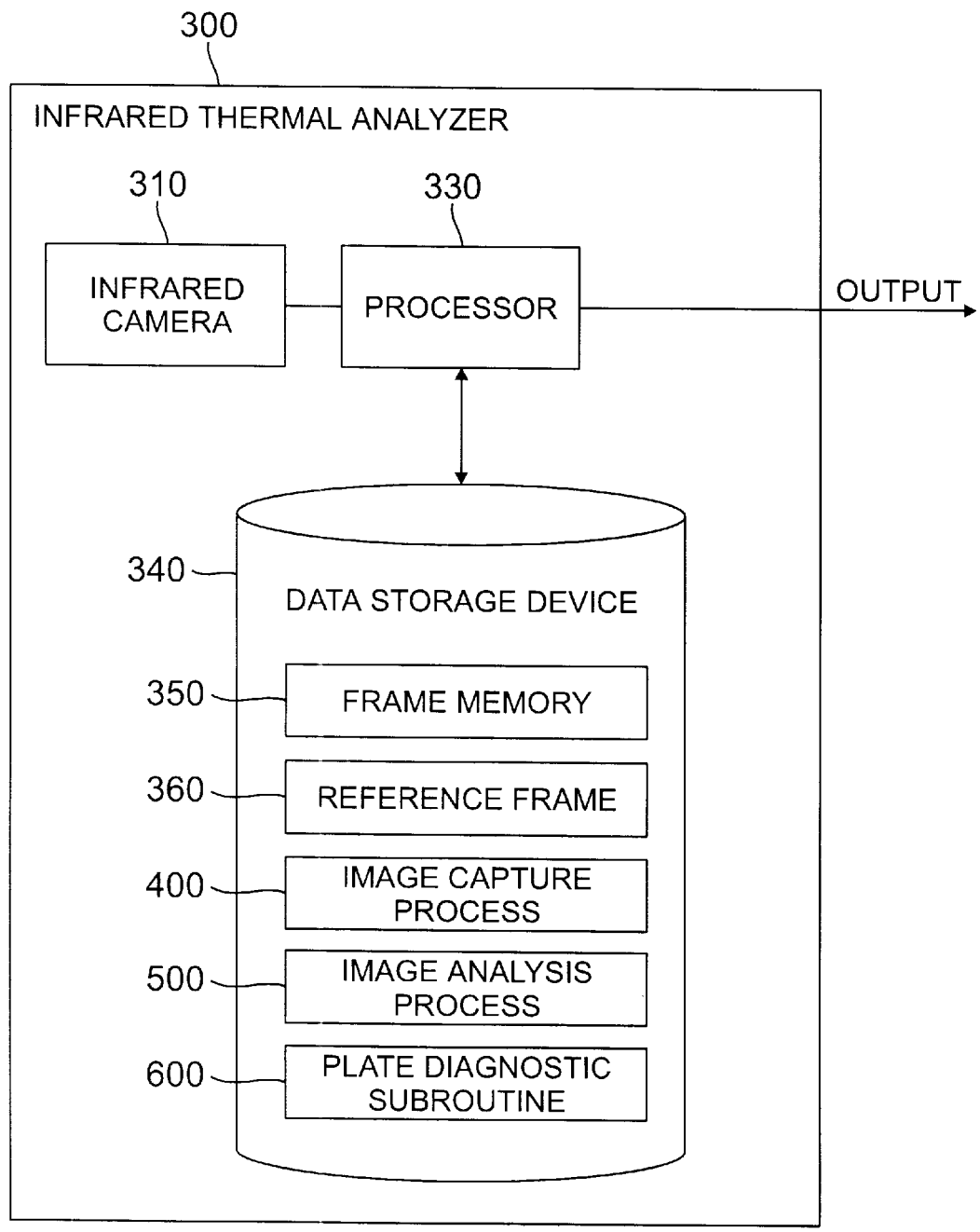
FIG. 3 is a schematic block diagram of an exemplary infrared thermal analyzer of FIG. 1.

FIG. 3 is a block diagram showing the architecture of an illustrative infrared thermal analyzer 300. The infrared thermal analyzer 300 may be embodied, for example, as a commercially available infrared thermal analyzer, such as those manufactured by AGEMA, Barnes and Inframetrics, as modified herein to evaluate the IR thermal dissipation of an active plate 200. As shown in FIG. 3, the infrared thermal analyzer 300 preferably consists of an infrared camera 310 and an image analyzer 320. The sensitivity and spatial resolution required by a given infrared camera 310 is determined by parameters of the active plate 200 to be tested. Although the field-of-view 140 of current commercially available infrared cameras 310 is typically sufficient to image the entire area of an active plate 200, the available resolution typically provides detection of gross areas containing defects. Thus, a known step-and-repeat process of increasing resolution is preferably utilized to focus in on regions containing anomalous luminosity to localize individual defective pixels.

The infrared thermal analyzer 300 preferably includes a processor 330 and related memory, such as a data storage device 340. The processor 330 may be embodied as a single processor, or a number of processors operating in parallel. The data storage device 340 and/or a read only memory (ROM) are operable to store one or more instructions, which the processor 330 is operable to retrieve, interpret and execute. The processor 330 preferably includes a control unit, an arithmetic logic unit (ALU), and a local memory storage device, such as, for example, an instruction cache or a plurality of registers, in a known manner. The control unit is operable to retrieve instructions from the data storage device 340 or ROM. The ALU is operable to perform a plurality of operations needed to carry out instructions. The local memory storage device is operable to provide high-speed storage used for storing temporary results and control information.

As previously indicated, defects in an active plate 200 are identified by detecting variations in pixel intensity values from an expected intensity value. The expected intensity value can be obtained by averaging the pixel intensity values of a given frame, or by means of a reference frame, corresponding to an ideal or a defect-free active plate 200. Thus, the data storage device 340 preferably contains an area of frame memory 350 for storing one or more images of one or more active plate 200 being evaluated. In addition, the data storage device 340 preferably contains an area of reference frame memory 360 for optionally storing one or more reference frames corresponding to each active plate 200 configuration.

As discussed further below in conjunction with FIGS. 4 through 6, the data storage device 340 preferably also includes an image capture process 400, an image analysis process 500 and a plate diagnostic subroutine 600. Generally, the image capture process 400 obtains one or more images of the active plate 200, preferably after the pixels 230 of the active plate 200 have reached a stable operating temperature. The image analysis process 500 preferably analyzes the images obtained by the infrared camera 310 to identify regions of the active plate 200 having image intensity values that deviate from an expected or average image intensity value by more than a predefined tolerance. The plate diagnostic subroutine 600 preferably further analyzes the regions identified by the image analysis process 500 at higher resolution to identify defective pixels and the potential source of defects in the fabrication process. Information obtained by the plate diagnostic subroutine 600 may be utilized to repair a defective active plate 200, as would be apparent to a person of ordinary skill. It is noted that many commercially available infrared thermal analyzers 300, such as those identified above, provide software features incorporating features of the image capture process 400 and image analysis process 500 to study heating dynamics of a generic device being tested.

Figure 4:
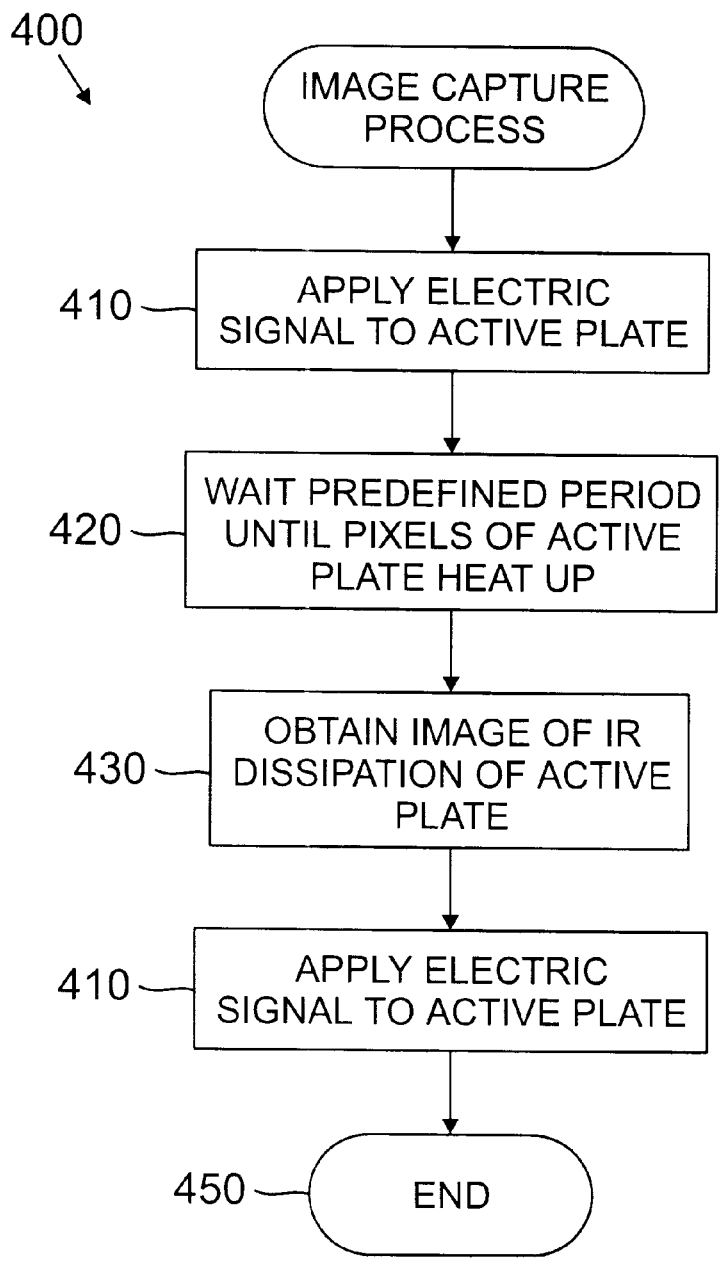
FIG. 4 is a flow chart describing an exemplary image capture process as implemented by the infrared thermal analyzer of FIG. 3.

As discussed above, the infrared thermal analyzer 300 preferably executes an image capture process 400, shown in FIG. 4, to obtain one or more images of the active plate 200, preferably after the pixels 230 of the active plate 200 have reached a stable operating temperature. As illustrated in FIG. 4, the image capture process 400 begins the processes embodying the principles of the present invention during step 410 by applying an appropriate electric signal to the active plate 200 being tested. Thereafter, the image capture process 400 preferably waits a predefined period during step 420 until the pixels 230 of the active plate 200 heat up to a stable operating temperature. It is noted that in a time-resolved implementation, multiple images of the active plate 200 would be taken during step 420, as the pixels 230 of the active plate 200 heat up.

The infrared camera 310 then takes an image of the IR dissipation of the active plate 200 during step 430, using a step-and-repeat procedure, if necessary, and stores the obtained image in the frame memory 350 during step 440. Thereafter, program control terminates during step 450.

Figure 5:
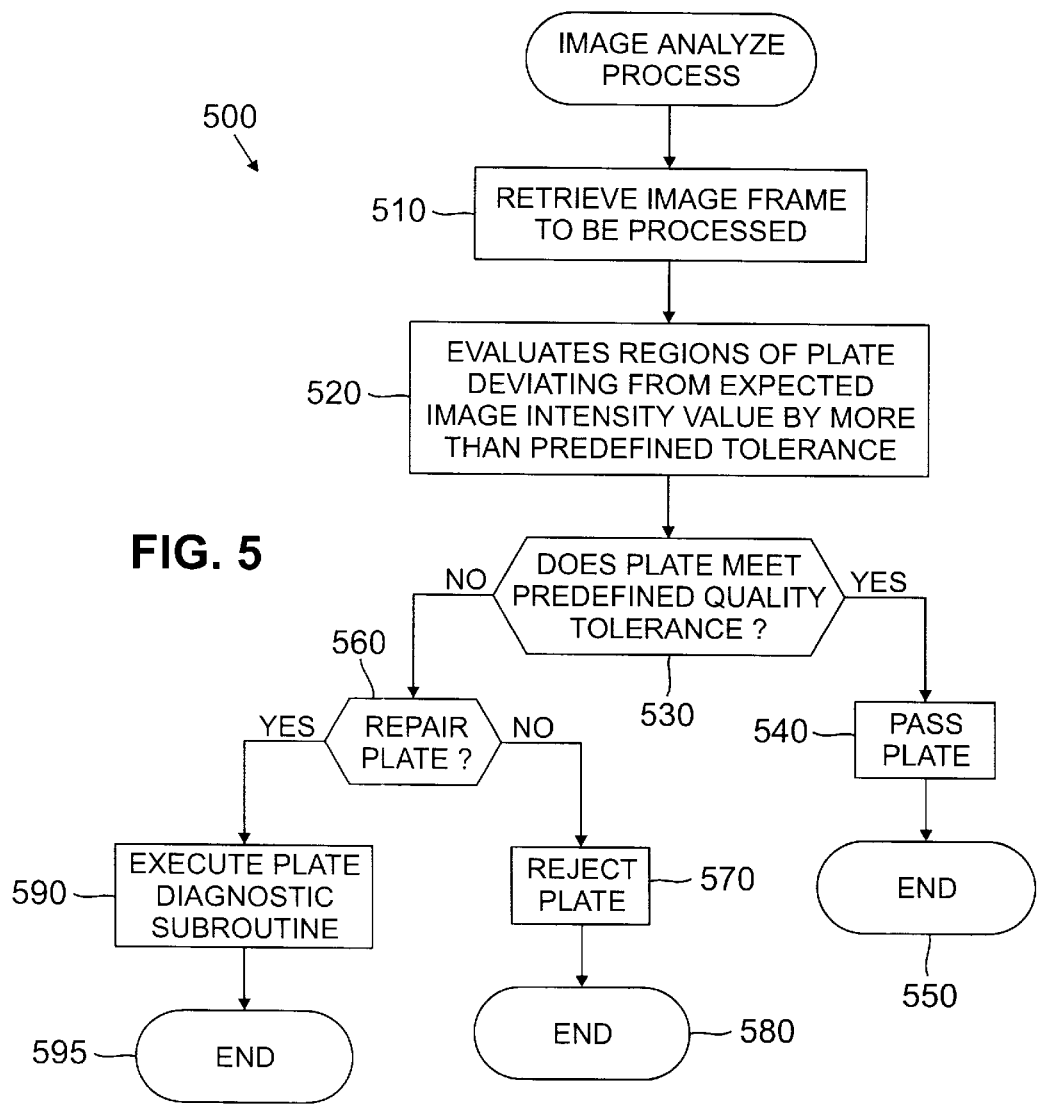
FIG. 5 is a flow chart describing an exemplary image analysis process as implemented by the infrared thermal analyzer of FIG. 3.

As discussed above, the infrared thermal analyzer 300 preferably executes an image analysis process 500, shown in FIG. 5, to analyze the images obtained by the infrared camera 310 and to identify regions of the active plate 200 having image intensity values that deviate from an expected or average image intensity value by more than a predefined tolerance. As illustrated in FIG. 5, the image analysis process 500 begins the processes embodying the principles of the present invention during step 510 by retrieving an image frame to be processed from the frame memory 350.

The image analysis process 500 then identifies the number of regions within the active plate 200 during step 520 that have intensity values deviating from an expected intensity value by more than a predefined tolerance. It is noted that the expected image intensity value and the predefined tolerance are dependent upon the electrical parameters of the active plate 200 being tested. It is further noted that step 520 may be performed by means of a visual inspection of the image frame, or algorithmically.

Thereafter, a test is performed during step 530 to determine if the quality of the active plate 200 meets a predefined tolerance, for example, by evaluating the number and density of regions identified during step 520. It is noted that the predefined tolerance is dependent upon the specifications of the active plate 200 being tested. If it is determined during step 530 that the quality of the active plate 200 does not meet a predefined tolerance, then the plate 200 passes inspection during step 540 and program control terminates during step 550.

If, however, it is determined during step 530 that the quality of the plate 200 does not meet a predefined tolerance, then a further test is performed during step 560 to determine if the active plate 200 is within a repairable limit. If it is determined during step 560 that the plate 200 should not be repaired, then the plate 200 is rejected during step 570 and program control terminates during step 580. If, however, it is determined during step 560 that the plate 200 should be repaired, then a plate diagnostic subroutine 600 (FIG. 6) is preferably executed during step 590, before program control terminates during step 595.

Figure 6:
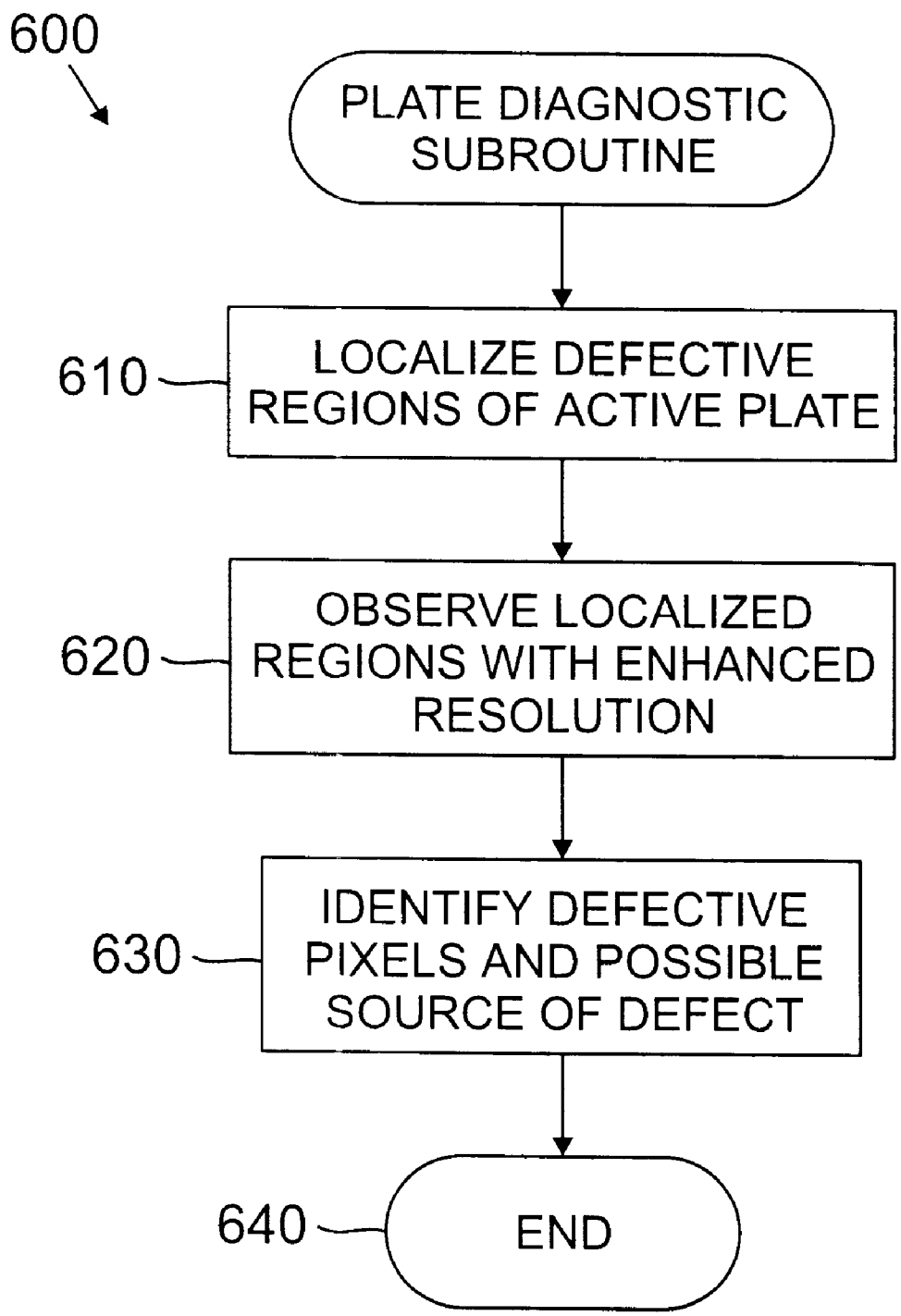
FIG. 6 is a flow chart describing an exemplary plate diagnostic subroutine as implemented by the infrared thermal analyzer of FIG. 3.

As discussed above, the infrared thermal analyzer 300 preferably executes a plate diagnostic subroutine 600, shown in FIG. 6, to further analyze the regions identified by the image analysis process 500 at higher resolution in order to identify defective pixels and the potential source of defects in the fabrication process. As illustrated in FIG. 6, the plate diagnostic subroutine 600 begins the processes embodying the principles of the present invention during step 610 by initially localizing the identified defective regions of the plate 200, using known localization techniques.

Thereafter, the localized regions are observed during step 620 using the infrared camera 310 with higher resolution. Finally, defective pixels are identified during step 630, together with possible sources of the defects in the fabrication process. Thereafter, program control terminates during step 640.

Once defective pixels are identified in this manner, such information obtained by the plate diagnostic subroutine 600 may be utilized to repair a defective active plate 200, as would be apparent to a person of ordinary skill.

It is to be understood that the embodiments and variations shown and described herein are merely illustrative of the principles of this invention and that various modifications may be implemented by those skilled in the art without departing from the scope and spirit of the invention.

I claim:

1. A method of testing an active plate of a flat panel display, said active plate having shorting bars and a plurality of uniform pixels, said method comprising the steps of:

applying an electrical signal to said shorting bars of said active plate, said electrical signal causing said pixels of active plate to exhibit thermal dissipation;

recording an infrared image of the thermal dissipation of said pixels; and identifying a non-uniformity in said image corresponding to a defect in said active plate.

2. The method according to claim 1, wherein said recording step is performed after said pixels have heated up.

3. The method according to claim 1, wherein said electric signal is an AC signal.

4. The method according to claim 1, wherein said electric signal is a DC signal.

5. The method according to claim 1, wherein said electric signal is a pulsed signal.

6. The method according to claim 1, wherein said testing method is performed under varying voltage conditions.

7. The method according to claim 1, wherein said testing method is performed during the fabrication process.

8. The method according to claim 1, wherein said non-uniformity consists of a region of said image having an image intensity that deviates from an expected image intensity by more than a predefined tolerance.

9. The method according to claim 1, wherein said non-uniformity consists of a bright pot or a dark spot corresponding to a defective region of the active plate.

10. The method according to claim 1, wherein said recording step is performed after said pixels reach a stable operating temperature.

11. The method according to claim 1, wherein said recording step obtains one or more images of said active plate as said pixels reach a stable operating temperature.

12. A method of testing a flat panel display substrate having shorting bars and a plurality of uniform pixels, said method comprising the steps of:

applying an electric signal to said shorting bars of said flat panel display substrate;

permitting said pixels to heat up for a predefined time period;

employing an infrared thermal analyzer to record and analyze heating response characteristics of said substrate; and identifying a non-uniformity in said heating response characteristics corresponding to a defect in said active plate.

13. The method according to claim 12, wherein said predefined period permits said pixels to reach a stable operating temperature.

14. The method according to claim 12, wherein said testing method is performed under varying voltage conditions.

15. The method according to claim 12, wherein said testing method is performed during the fabrication process.

16. The method according to claim 12, wherein said non-uniformity consists of a region of said image having an image intensity that deviates from an expected image intensity by more than a predefined tolerance.

17. The method according to claim 12, wherein said non-uniformity consists of a bright spot or a dark spot corresponding to a defective region of the active plate.

18. The method according to claim 12, wherein said recording step obtains one or more images of said active plate as said pixels reach a stable operating temperature.

19. A system for testing an active plate of a flat panel display, said active plate having shorting bars and a plurality of pixels, said system comprising:

a voltage source for applying an electric signal to said shorting bars of said active plate, said electric signal causing said pixels of said active plate to exhibit thermal dissipation;

an infrared camera for recording an image of the thermal dissipation of said pixels; and an image analyzer for identifying a non-uniformity in said image corresponding to a defect in said active plate.

20. The system according to claim 19, wherein said electric signal is an AC signal.

21. The system according to claim 19, wherein said electric signal is a DC signal.

22. The system according to claim 19, wherein said non-uniformity consists of a region of said image having an image intensity that deviates form an expected image intensity by more than a predefined tolerance.

23. The system according to claim 19, wherein said non-uniformity consists of a bright spot or a dark spot corresponding to a defective region of the active plate.

24. A method of testing an active plate of a flat panel display, said active plate having shorting bars and a plurality of uniform pixels, said method comprising the steps of:

applying an electrical signal to each of said pixels;

recording a plurality of images of the infrared dissipation of said pixels over time; and evaluating said images of said active plate over time as said pixels heat up in response to said applied electric signal.

* * * * *

UNITED STATES PATENT AND TRADEMARK OFFICE
CERTIFICATE OF CORRECTION

PATENT NO.    : 6,111,424
DATED         : August 29, 2000
INVENTOR(S)   : Bruno Bosacchi It is certified that error appears in the above-identified patent and that said Letters Patent is hereby corrected as shown below:

<u>Title page,</u>
Item [56], U.S. PATENT DOCUMENTS, please add the following
```
-- 3,991,302   11/9/76    Danner ............... 250/338.1
   5,235,400   8/10/93    Terasawa et al. ....... 356/394
   5,363,037   11/8/94    Henley et al. .......... 324/158.1
   5,440,566   8/8/95     Spence et al. .......... 374/41
   5,459,410   10/17/95   Henley ................. 324/770
   5,465,052   11/7/95    Henley ................. 324/770
   5,504,438   4/2/96     Henley ................. 324/770
   5,543,729   8/6/96     Henley ................. 324/770
   5,570,011   10/29/96   Henley ................. 324/158.1 --
```

Signed and Sealed this

Twenty-ninth Day of July, 2003

JAMES E. ROGAN
*Director of the United States Patent and Trademark Office*